United States Patent
Chang et al.

(10) Patent No.: US 11,616,431 B2
(45) Date of Patent: Mar. 28, 2023

(54) CONTROL CIRCUIT OF POWER CONVERTER

(71) Applicant: uPI semiconductor corp., Zhubei (TW)

(72) Inventors: Chih-Lien Chang, Zhubei (TW); Wei-Hsiu Hung, Zhubei (TW); Chun-Ming Lu, Zhubei (TW); Min-Rui Lai, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 51 days.

(21) Appl. No.: 17/511,813

(22) Filed: Oct. 27, 2021

(65) Prior Publication Data

US 2022/0149734 A1 May 12, 2022

(30) Foreign Application Priority Data

Nov. 12, 2020 (CN) .......................... 202011259103.1

(51) Int. Cl.
*H02M 3/158* (2006.01)
*H02M 1/00* (2006.01)
*H02M 3/156* (2006.01)
*H03K 7/08* (2006.01)

(52) U.S. Cl.
CPC ....... *H02M 1/0025* (2021.05); *H02M 1/0009* (2021.05); *H02M 3/158* (2013.01); *H02M 3/1566* (2021.05); *H03K 7/08* (2013.01)

(58) Field of Classification Search
CPC .. H02M 1/0025; H02M 3/1566; H02M 3/158; H02M 1/0009
See application file for complete search history.

(56) References Cited

U.S. PATENT DOCUMENTS

| | | | |
|---|---|---|---|
| 8,624,574 B2 | 1/2014 | Chien et al. | |
| 8,698,476 B2 | 4/2014 | Chen et al. | |
| 8,860,483 B2 | 10/2014 | Wang et al. | |
| 9,013,165 B2 | 4/2015 | Kalje et al. | |
| 9,831,774 B2 | 11/2017 | Huang | |
| 2018/0337599 A1* | 11/2018 | Chen | H02M 3/158 |
| 2019/0305566 A1* | 10/2019 | Hsu | H02M 3/158 |

* cited by examiner

*Primary Examiner* — Alex Torres-Rivera
(74) *Attorney, Agent, or Firm* — McClure, Qualey & Rodack, LLP

(57) ABSTRACT

A control circuit of a power converter includes a sensing circuit, a ramp signal generation circuit and a PWM circuit. The sensing circuit, coupled to an output circuit, provides a current sensing signal. The ramp signal generation circuit includes a transient circuit and a signal generation circuit. The transient circuit receives the current sensing signal and generates a variable reference voltage. The signal generation circuit provides a ramp signal according to the variable reference voltage. The PWM circuit provides a PWM signal to the output circuit according to the ramp signal. When current sourcing occurs, it continues for a first default time. A transient state during current sourcing continues for a second default time less than first default time. The variable reference voltage is changed from a default value to an adjusted value during the second default time and restored to the default value after the second default time.

6 Claims, 7 Drawing Sheets

FIG. 2 (PRIRO ART)

CONTROL CIRCUIT OF POWER CONVERTER

BACKGROUND OF THE INVENTION

1. Field of the Invention

The invention relates to a power converter; in particular, to a control circuit of the power converter.

2. Description of the Prior Art

As shown in FIG. 1, FIG. 1 is a power converter. This system uses an output voltage VOUT for voltage feedback control and uses output currents IL1 and IL2 for current feedback control. In the voltage feedback control, an error amplifier EA and a compensation circuit COM generate a compensation signal COMP according to the output voltage VOUT and a default voltage VREF. In the current feedback control, this system will add the information of a total output current IL summing the output currents IL1 and IL2 of each phase to a ramp signal RAMP to change a waveform of the ramp signal RAMP. In addition, the comparator CP compares the compensation signal COMP with the ramp signal RAMP to generate a pulse width modulation signal PWM to control an output circuit OS to convert an input voltage VIN into the output voltage VOUT.

As shown in FIG. 1 and FIG. 2, the above-mentioned power converter adds the information of the total output current (the inductor current) IL to the ramp signal RAMP in a form of DC offset OFF. At the time T1, transient occurs due to external current sourcing, and the total output current IL is pulled up to supply current required for external current sourcing, and the output voltage VOUT is also dropped due to the external current sourcing. At this time, the compensation signal COMP related to the output voltage VOUT rises because the output voltage VOUT drops, and the DC offset provided by the total output current IL also raises the ramp signal RAMP. Because the amplitude of the ramp signal RAMP is fixed, the position where the compensation signal COMP and the ramp signal RAMP intersect is also raised. The output voltage VOUT droops through this feedback control. In other words, the system does not need to forcefully pull up the output voltage VOUT during transients, thereby eliminating the ringing phenomenon of the output voltage VOUT to stabilize the output voltage VOUT quickly and achieve an effect of shortening transient response.

However, since the system has a limitation of headroom (a voltage difference between an operating voltage VCC and ground), a disadvantage of the above-mentioned technology is that the ramp signal RAMP will be raised with the loading degree of the total output current IL and maintain the state of being raised in a current sourcing period from the time t1 to the time t5. Once the current sourcing is too heavy, the position of the ramp signal RAMP will be limited by the operating voltage VCC and reach an upper limit, so the current sourcing is limited and unable to become heavier. In detail, since the ramp signal RAMP has the same amplitude and is limited by the operating voltage VCC, when the current sourcing become heavier, the information of the output current IOUT will not be completely added to the ramp signal RAMP due to insufficient headroom, resulting in that the aforementioned current feedback control mechanism is abnormal and fails to eliminate the ringing phenomenon. Even it enters a stable state at the time t4, the output voltage VOUT cannot be restored to the level before the current sourcing. Until the time t5, it is unloaded, the feedback control and output will return to normal operation. It can be seen from the above that the circuit design of the prior art is limited by the headroom, which leads to the limitation of the output capacity of the system to deal with the current sourcing.

SUMMARY OF THE INVENTION

Therefore, the invention provides a control circuit of a power converter to solve the above-mentioned problems of the prior arts.

A preferred embodiment of the invention is a control circuit of a power converter. In this embodiment, the control circuit is coupled to an output circuit. The control circuit includes a sensing circuit, a ramp signal generation circuit and a pulse width modulation (PWM) circuit. The sensing circuit is coupled to the output circuit and configured to provide a current sensing signal. The ramp signal generation circuit includes a transient circuit and a signal generation circuit. The transient circuit is coupled between the sensing circuit and the signal generation circuit and configured to receive the current sensing signal and generate a variable reference voltage. The signal generation circuit is configured to provide a ramp signal according to the variable reference voltage. The PWM circuit is coupled to the ramp signal generation circuit and the output circuit and configured to provide a PWM signal to the output circuit according to the ramp circuit. When a current sourcing occurs, the current sourcing continues for a first default time. There is a transient state during the current sourcing, and the transient state continues for a second default time less than first default time. The variable reference voltage provided by the transient circuit during the second default time is changed from a default value to an adjusted value. The transient circuit restores the variable reference voltage to the default value after the second default time.

In an embodiment, the variable reference voltage is a peak voltage of the ramp signal.

In an embodiment, the transient circuit includes a filter. The filter is coupled to the sensing circuit and configured to receive a reference voltage and the current sensing signal to generate the variable reference voltage.

In an embodiment, the filter includes a resistor and a capacitor, and the second default time is related to a resistance-capacitance delay generated by the resistor and the capacitor.

In an embodiment, the transient circuit includes a filter and a signal conversion circuit. The filter includes a resistor and a capacitor coupled in series between a ground terminal and a sensing voltage. The sensing voltage is related to the current sensing signal. The signal conversion circuit is coupled to a first node and a second node at both terminals of the resistor respectively and configured to provide the variable reference voltage according to a voltage difference between the first node and the second node.

In an embodiment, the second default time is related to a resistance-capacitance delay generated by the resistance and the capacitor.

Compared to the prior art, the peak voltage of the ramp signal in the control circuit of the power converter of the invention will return to a default voltage after the transient state ends and enters a stable state, so that the ramp signal will not cause the control loop to fail due to current sourcing compression; therefore, it can overcome the shortcoming that the conventional ramp signal is limited by the headroom of the operating voltage (VCC), so as to greatly increase the freedom of circuit design. In addition, the output current feedback control of the control circuit of the power converter of the invention will not fail during the heavy current sourcing period, so it can provide a stable output.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
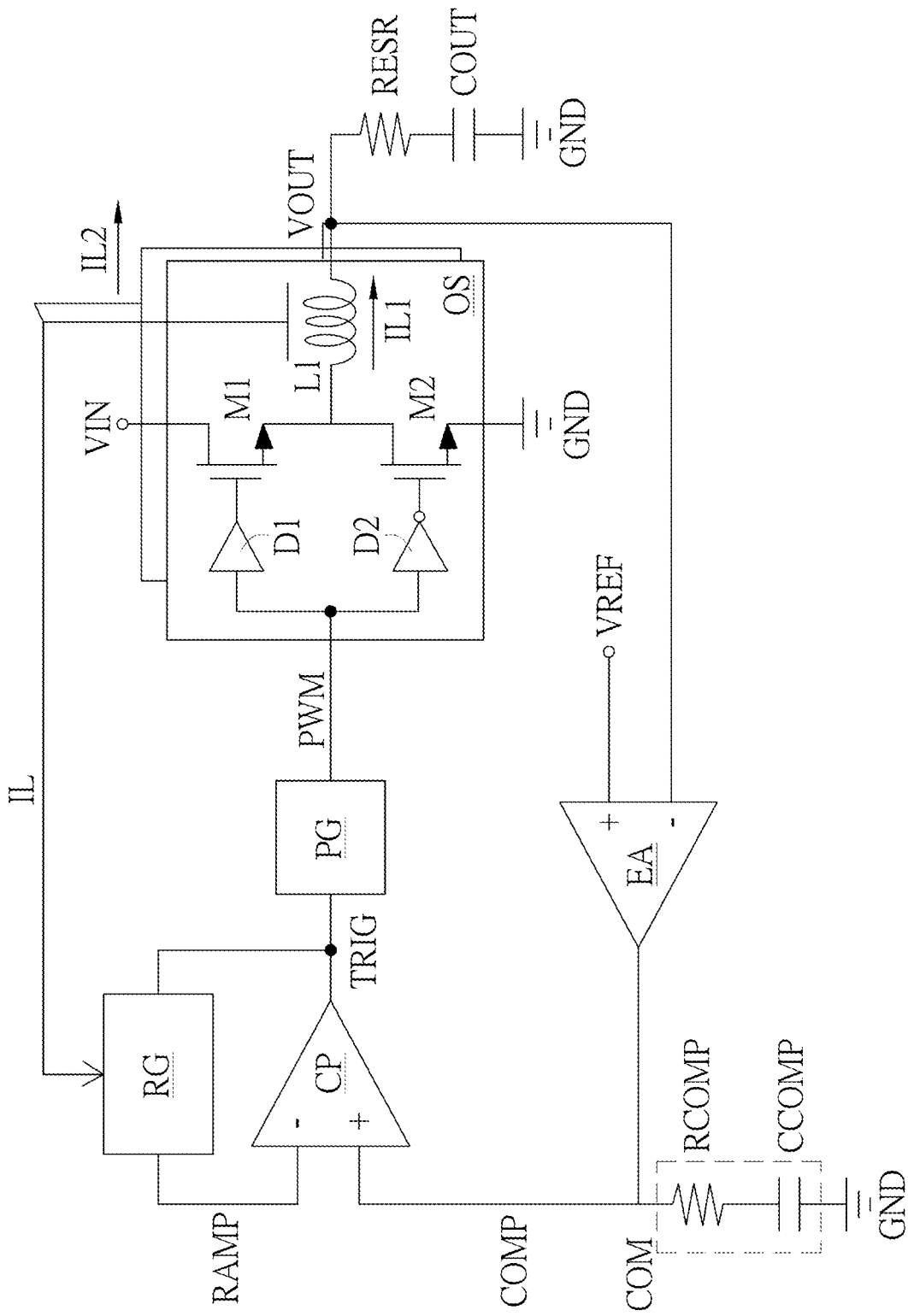
FIG. 1 illustrates a functional bock diagram of the power converter in the prior art.

Reference will now be made in detail to the exemplary embodiments, the same or similar reference numbers or components used in the drawings and the embodiments are used to represent the same or similar parts.

An embodiment of the invention is a control circuit of a power converter. In this embodiment, the control circuit can be applied to single-phase or multi-phase power converters, depending on actual requirements.

Figure 3:
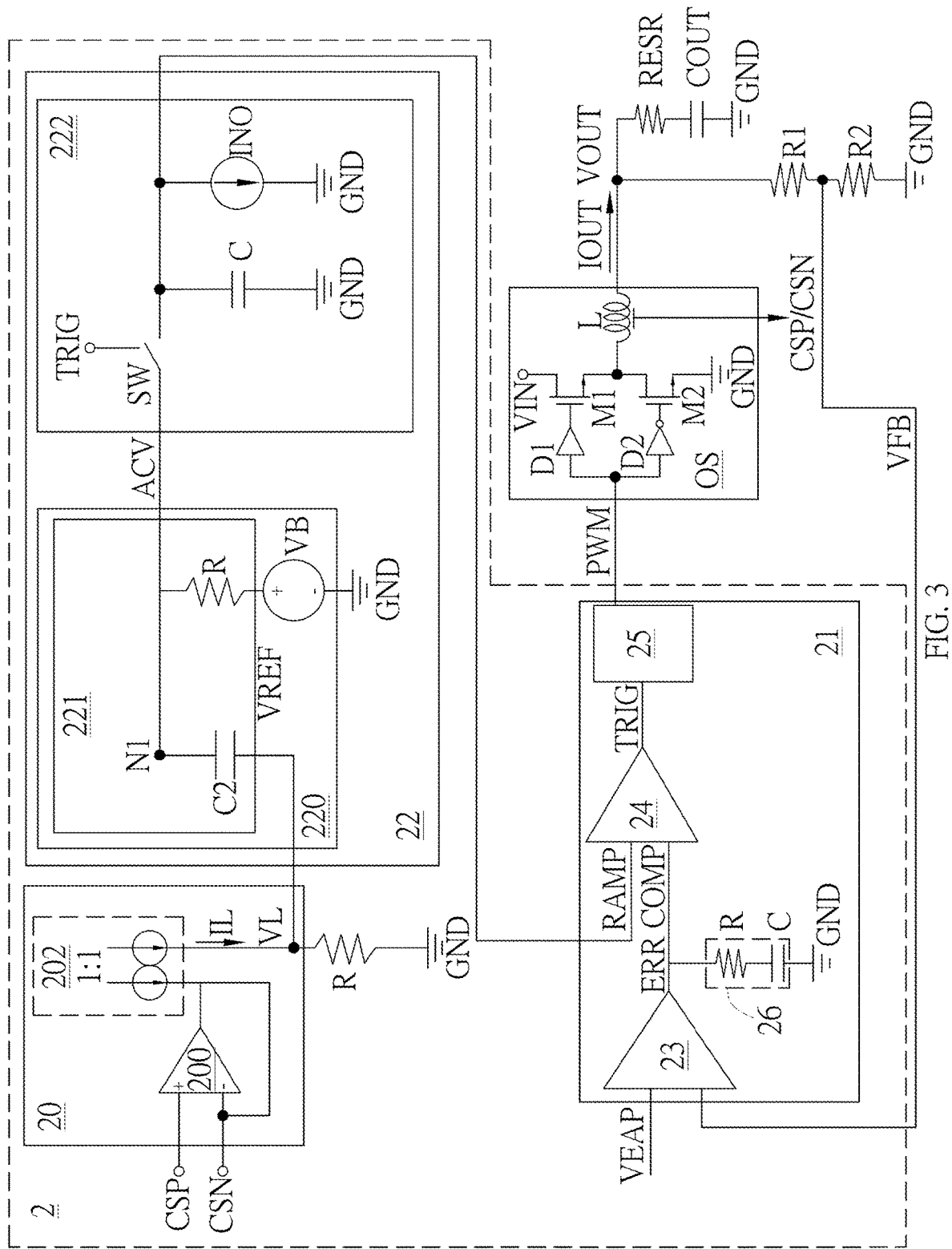
FIG. 3 and FIG. 4 illustrate different embodiments of the control circuit of the invention being applied to the single-phase and the two-phase power converters respectively.

Please refer to FIG. 3. FIG. 3 illustrates a schematic diagram of a control circuit of a power converter applied to a single-phase power converter. As shown in FIG. 3, the control circuit 2 of the power converter is coupled to an output circuit OS. Voltage-dividing resistors R1 and R2 are coupled in series between the output circuit OS and a ground terminal GND. An output capacitor COUT and an output resistance RESR equivalent to its parasitic resistance are also coupled in series between the output circuit OS and the ground terminal GND.

The output circuit OS includes drivers D1~D2, switches M1~M2 and an output inductor L. The driver D1 is coupled between the control circuit 2 and a control terminal of the switch M1. The driver D2 is coupled between the control circuit 2 and a control terminal of the switch M2. The switches M1 and M2 are coupled in series between an input voltage VIN and the ground terminal GND. One terminal of the output inductor L is coupled between the switches M1 and M2 and the other terminal of the output inductor L is coupled to the output resistor RESR and the voltage-dividing resistor R1.

The control circuit 2 includes a sensing circuit 20, a pulse width modulation (PWM) circuit 21 and a ramp signal generation circuit 22. The pulse width modulation circuit 21 includes an error amplifier 23, a comparator 24, a pulse width modulation logic circuit 25 and a compensation circuit 26. The sensing circuit 20 is coupled to the output circuit OS and the ramp signal generation circuit 22. The ramp signal generation circuit 22 is coupled to the sensing circuit 20 and an input terminal of the comparator 24. One input terminal of the error amplifier 23 is coupled between the resistors R1 and R2 and the other input terminal receives a reference voltage VEAP. An output terminal of the error amplifier 23 is coupled to the compensation circuit 26. The compensation circuit 26 is coupled to the other input terminal of the comparator 24. An output terminal of the comparator 24 is coupled to the pulse width modulation logic circuit 25. The pulse width modulation logic circuit 25 is coupled to the output circuit OS.

The two input terminals of the error amplifier 23 receive the reference voltage VEAP and an output feedback voltage VFB of the power converter respectively to provide an error amplification signal ERR. The compensation circuit 26 is coupled to the error amplifier 23 and the comparator 24 to compensate the error amplified signal ERR to become a compensation signal COMP.

The output feedback voltage VFB received by an input terminal of the error amplifier 23 is a divided voltage generated by the voltage-dividing resistors R1 and R2 according to the output voltage VOUT of the power converter, but not limited to this. The error amplifier 23 is a trans-impedance amplifier, and the error amplification signal ERR provided by it is in a form of current, but not limited to this.

The sensing circuit 20 is used to receive current indication signals CSP/CSN related to an output current IOUT of the output circuit OS and provide a current sensing signal. In this embodiment, the current indication signal is a set of current indication signals CSP/CSN in a form of voltage. The sensing circuit 20 includes an amplifier 200 and a current mirror 202. Two input terminals of the amplifier 200 receive the current indication signals CSP/CSN and the amplifier 200 outputs a comparison result to control the current mirror 202 with a ratio of 1:1 to generate the current sensing signal (i.e., the sensing current IL) in a form of current.

In practical applications, the resistor R can be coupled between the current mirror 202 and the ground terminal GND. When the sensing current IL outputted by the current mirror 202 flows through the resistor R, the current sensing signal in a form of voltage (i.e., the sensing voltage VL) is formed at the terminal of the resistor R coupled to the current mirror 202.

The ramp signal generation circuit 22 includes a transient circuit 220 and a signal generation circuit 222. The transient circuit 220 is coupled between the sensing circuit 20 and the signal generation circuit 222 and used for receiving the sensing current IL provided by the sensing circuit 20, and providing a variable reference voltage ACV to the signal generation circuit 222 when the transient caused by current sourcing occurs. The signal generation circuit 222 generates a ramp signal RAMP to an input terminal of the comparator 24 according to the variable reference voltage ACV.

When the transient caused by current sourcing occurs, the variable reference voltage ACV provided by the transient circuit 220 will be changed from a default value to an adjusted value when the transient occurs, and then gradually restored to the default value. In other words, the variable reference voltage ACV, which was originally the default value, will be changed to the adjusted value in the transient state to deal with the current sourcing, but it will immediately start to be gradually changed from the adjusted value to the original default value to avoid the disadvantage that the ramp signal RAMP is limited by the headroom, so it can greatly increase the degree of freedom of circuit design.

In this embodiment, the transient circuit 220 includes a filter 221 and a voltage source VB. The filter 221 is coupled to the sensing circuit 20 and the signal generation circuit 222. When the filter 221 receives the sensing voltage VL and the default voltage VREF provided by the voltage source VB, the filter 221 filters the sensing voltage VL, and the filtered sensing voltage VL will be added to the default voltage VREF to generate the variable reference voltage ACV to the signal generation circuit 222. In other words, during the first default time that the current sourcing continues, there is a transient state during the current sourcing. The transient state continues for a second default time, and the second default time is less than the first default time. During the second default time, the reference voltage ACV is changed from the default value to an adjusted value, and restored to the default value after the second default time.

The filter 221 can be a high-pass filter (HPF) composed of a resistor R and a capacitor C2. The resistor R is coupled between the voltage source VB and the node N1; one terminal of the capacitor C is coupled to the node N1 and the other terminal of the capacitor C is coupled between the current mirror 202 and the resistor R, but not limited to this. It is worth mentioning that a resistance-capacitance delay generated by selecting the resistor R and the capacitor C can be used to set the second default time for the reference voltage ACV to be gradually changed from the adjusted value to the default value.

In this embodiment, the signal generation circuit 222 includes a switch SW, a capacitor C and a current source INO. The switch SW is coupled between the transient circuit 220 and an input terminal of the comparator 24, and the switch SW receives the reference voltage ACV and is controlled by a trigger signal TRIG provided by the comparator 24. When the trigger signal TRIG turns the switch SW on, the ramp signal RAMP is reset to the voltage level of the reference voltage ACV. In other words, the reference voltage ACV is used as a peak voltage of the ramp signal RAMP. One terminal of the capacitor C is coupled between the switch SW and the comparator 24 and the other terminal is coupled to the ground GND. The amplitude of the ramp signal RAMP is determined by the capacitance of the capacitor C. One terminal of the current source INO is coupled between the switch SW and the comparator 24 and the other terminal is coupled to the ground GND to discharge the capacitor C to generate a ramp signal RAMP with a falling slope.

Two input terminals of the comparator 24 receive the ramp signal RAMP and the compensation signal COMP respectively and generate the trigger signal TRIG to the pulse width modulation logic circuit 25 and the switch SW in the signal generation circuit 222.

Next, the pulse width modulation logic circuit 25 will provide a pulse width modulation signal PWM to the output circuit OS according to the trigger signal TRIG to control the operation of the output circuit OS. In detail, when the drivers D1 and D2 in the output circuit OS receive the pulse width modulation signal PWM, the drivers D1 and D2 control the switches M1 and M2 on or off respectively according to the pulse width modulation signal PWM to form the inductor current IL at the output inductor L and generate the output voltage VOUT.

Figure 4:
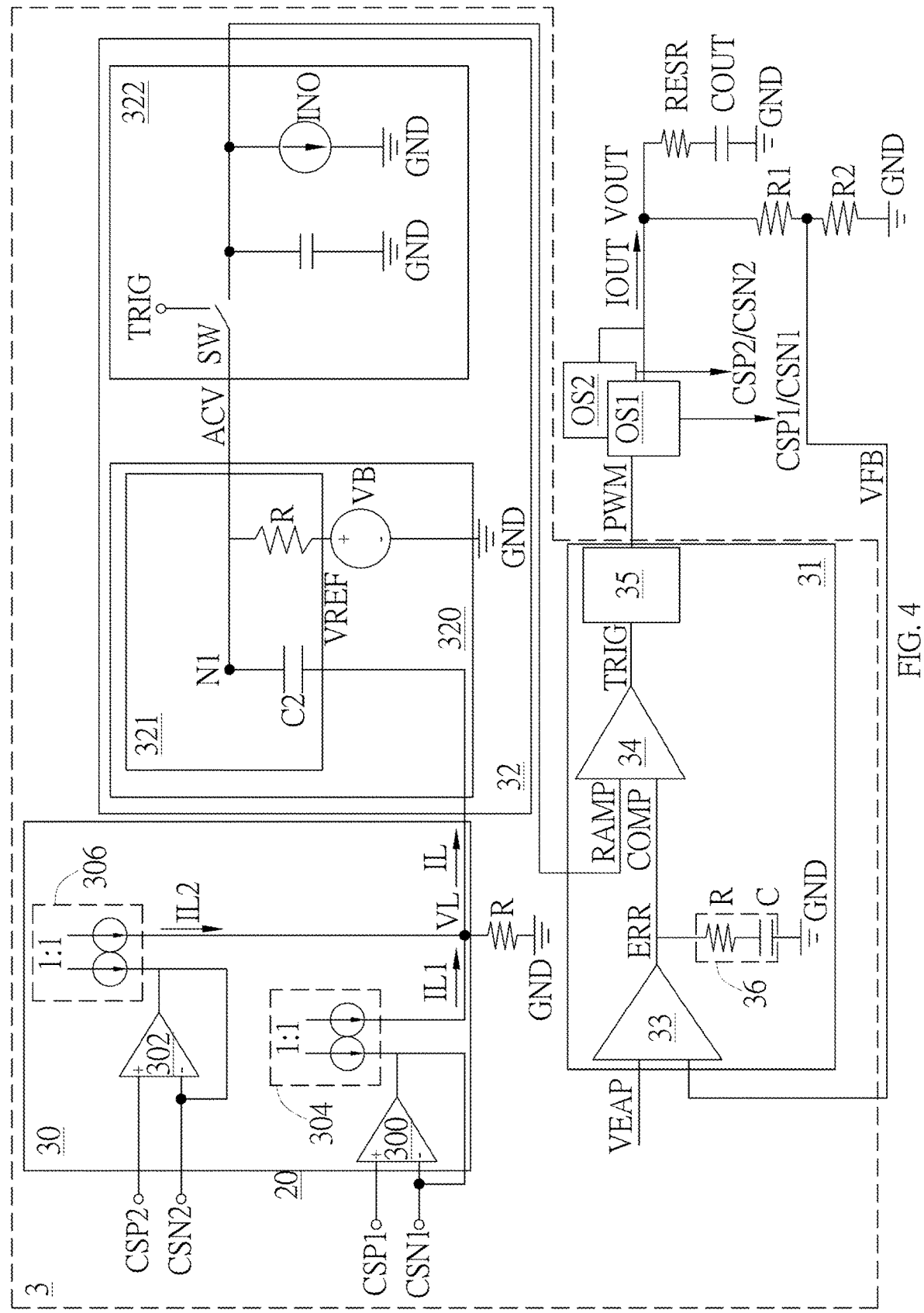

Next, please refer to FIG. 4. FIG. 4 illustrates a schematic diagram of the control circuit of the power converter applied to the two-phase power converter. As shown in FIG. 4, the control circuit 3 is coupled to the output circuits OS1~OS2 respectively. The voltage-dividing resistors R1 and R2 are coupled in series between the output circuits OS1~OS2 and the ground terminal GND. The output capacitor COUT and the output resistance RESR equivalent to its parasitic resistance are also coupled in series between the output circuits OS1~OS2 and the ground terminal GND.

The control circuit 3 includes a sensing circuit 30, a ramp signal generation circuit 32, an error amplifier 33, a compensation circuit 36, a comparator 34 and a pulse width modulation logic circuit 35. Since they are the same as the corresponding components of the above-mentioned control circuit 2, they will not be repeated here.

In this embodiment, the pulse width modulation logic circuit 35 generates pulse width modulation signals PWM1~PWM2 to the output circuits OS1~OS2 according to the trigger signal TRIG to control the operation of the output circuits OS1~OS2 respectively. The sensing circuit 30 includes amplifiers 300 and 302 and current mirrors 304 and 306.

Two input terminals of the amplifier 300 receive current indication signals CSP1/CSN1 related to the output current of the output circuit OS1 and the amplifier 300 outputs the comparison result to control the current mirror 304 with a 1:1 ratio to generate a sensing current IL1 of the output circuit OS1. Similarly, the two input terminals of the amplifier 302 receive the current indication signals CSP2/CSN2 related to the output current of the output circuit OS2 and the amplifier 302 outputs the comparison result to control the current mirror 306 with a 1:1 ratio to generate a sensing current IL2 of the output circuit OS2. The sensing circuit 30 outputs the sensing current IL, which is the sum of the sensing current IL1 and the sensing current IL2, to the ramp signal generation circuit 32.

In practical applications, one terminal of the resistor R is coupled to the current mirrors 304 and 306 respectively, and the other terminal of the resistor R is coupled to the ground terminal GND, the sensing current IL which is the sum of the sensing current IL1 and the sensing current IL2 flows through the resistor R to form a sensing voltage VL at one terminal of the resistor R. In addition to the above-mentioned single-phase and two-phase power converters, the control circuit of the invention can be further applied to multi-phase power converters by analogy without specific limitations.

Figure 5:
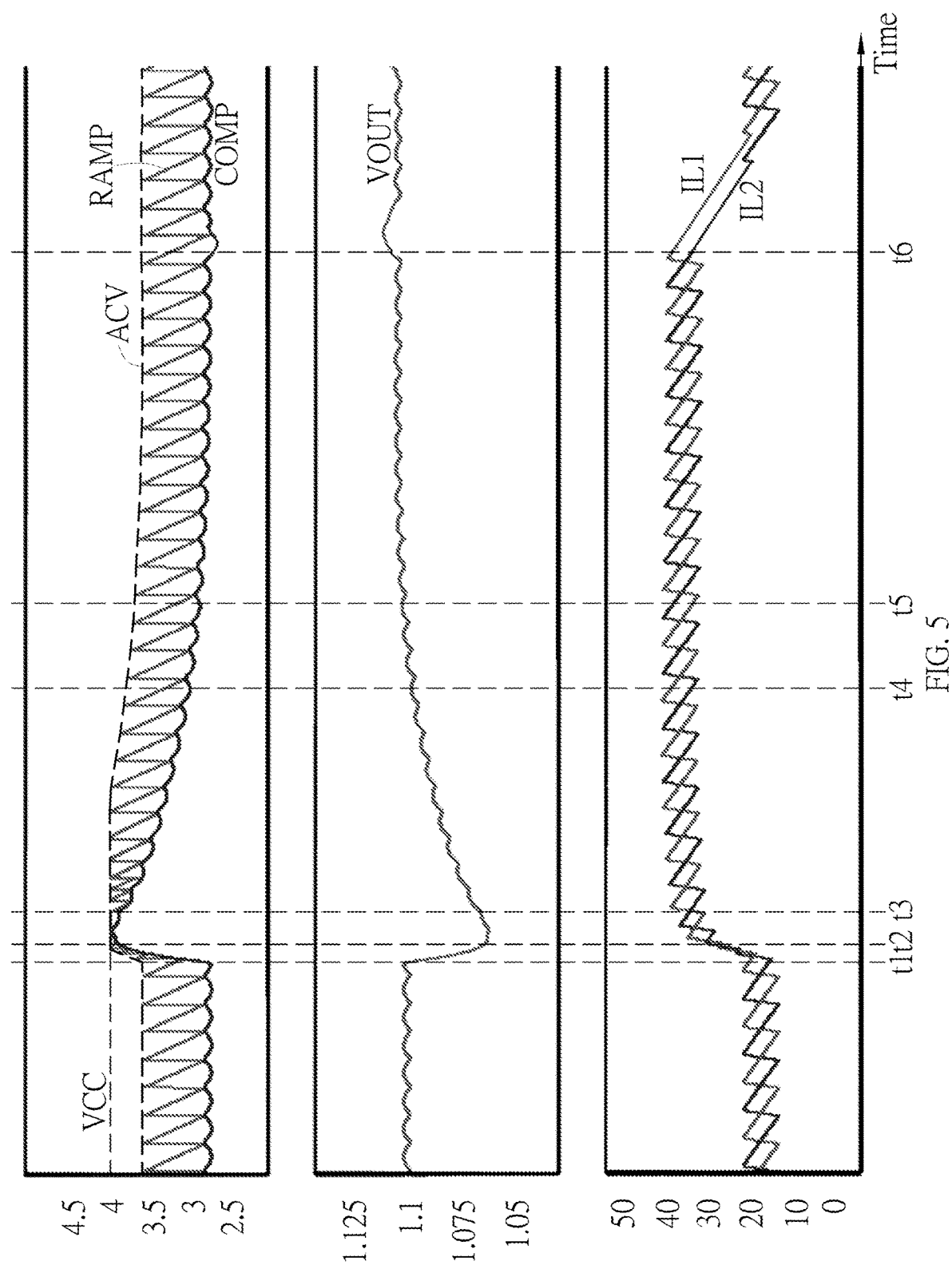
FIG. 5 illustrates a waveform diagram of the transient response of the power converter in the invention.

Please refer to FIG. 5. FIG. 5 illustrates a waveform diagram of the transient response of the two-phase power converter in the invention. It should be noted that the two-phase power converters in FIG. 2 of the prior art and FIG. 5 are both dual-channel applications and operated under the same current sourcing conditions (assuming that the inductor currents IL1~IL2 supplied by each channel are both 35 amperes, so the summed inductor current IL is 70 A, not shown). The amplitude of the ramp signal RAMP is 0.75 volts and the operating voltage VCC is 4 volts.

As shown in FIG. 5, before the time t1, since the current sourcing has not yet started, the inductor currents IL1~IL2 of the two channels have not risen, so that the output voltage VOUT, the compensation signal COMP and the ramp signal RAMP are maintained in a stable state and the peak voltage of the ramp signal RAMP (i.e., the reference voltage ACV) is smaller than the operating voltage VCC (4 volts).

At the time t1, when the current sourcing starts, the inductor currents IL1~IL2 of the two channels are both raised (that is, the summed inductor current IL is also raised), so that the output voltage VOUT is decreased due to the current sourcing, and the compensation signal COMP is raised as the output voltage VOUT is decreased, the reference voltage ACV is gradually restored to the default value after rising.

During the period from the time t2 to the time t3, due to the feedback information of the inductor current IL, the reference voltage ACV is larger than the operating voltage VCC (4V), which results in the limitation of the waveform of the ramp signal RAMP. Therefore, only the feedback information of the output voltage VOUT can be used to control during this period. It should be noted that during the period from the time t2 to the time t3, the feedback information of the inductor current IL cannot affect the ramp signal RAMP. Therefore, the performance of the power converter during this period is the same as the prior art, but due to the transient circuit 220 of the ramp signal generation circuit 22, the reference voltage ACV will be gradually restored to the default voltage 3.75V immediately after the transient occurs, so the period from the time t2 to the time t3 is very short.

At the time t3, the reference voltage ACV is lower than the operating voltage VCC (4V). At this time, the feedback information of the inductor current IL is added to the feedback control, so that the ringing phenomenon will not occur in the output voltage VOUT.

Figure 2:
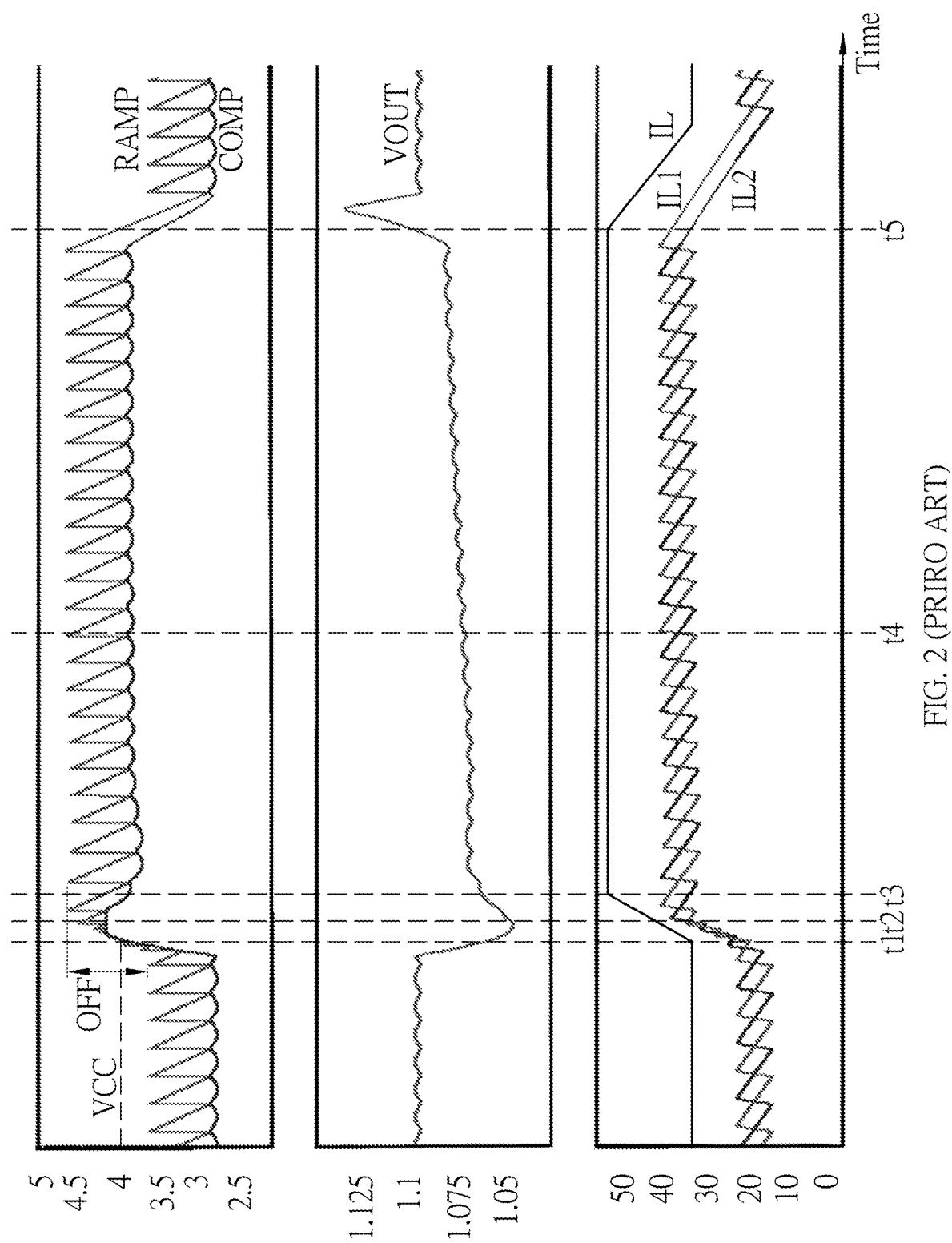
FIG. 2 illustrates a waveform diagram of the transient response of the power converter in the prior art.

At the time t4, the output voltage VOUT has increased to the same output voltage level (1.09 volts) as when the prior art shown in FIG. 2 enters the stable state. At the time t5, the transient state ends, the output voltage VOUT has restored to the stable state output voltage level (1.1 volts) before the current sourcing, and both the ramp signal RAMP and the compensation signal COMP tend to the stable state.

It can be seen from the above that during the current sourcing period of the first default time (from the time t1 to the time t6), the control circuit of the power converter of the invention adjusts the peak voltage of the ramp signal RAMP after the transient to make the intersection of the ramp signal RAMP and the compensation signal COMP is gradually restored to the stable value with time in the transient state of the second default time (from the time t1 to the time t5), so that the peak voltage of the ramp signal RAMP will not be limited by the operating voltage VCC to further enhance the flexibility of circuit design. In other words, the control circuit of the power converter of the invention can still effectively eliminate the ringing phenomenon of the output voltage VOUT during the heavy current sourcing to provide stable output.

Figure 6:
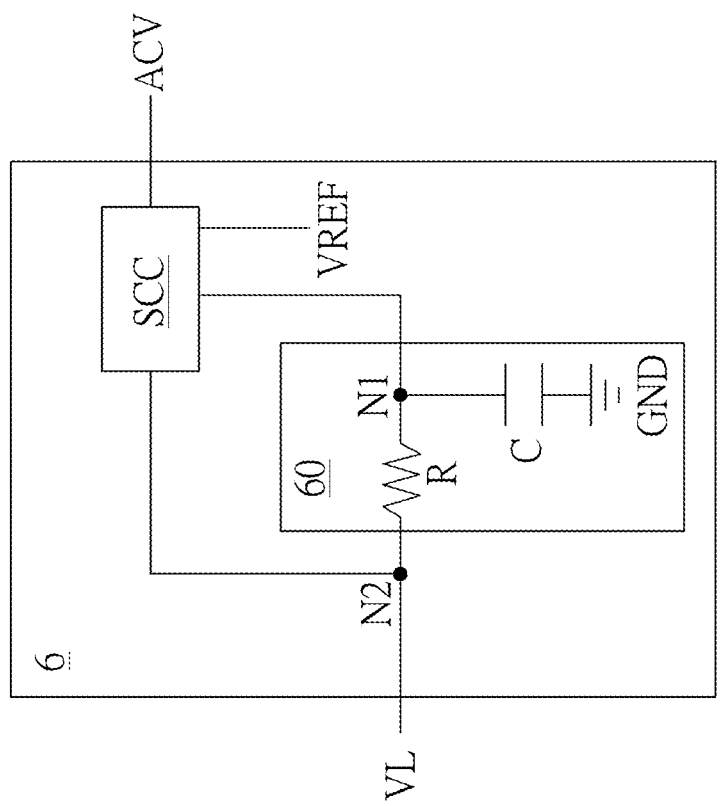
FIG. 6 illustrates another embodiment of the transient circuit of the invention.

Please refer to FIG. 6, in another embodiment, the transient circuit 6 includes a filter 60 and a signal conversion circuit SCC. The filter 60 includes a resistor R and a capacitor C coupled in series between the ground terminal GND and the sensing voltage VL. The resistor R is located between the nodes N1 and N2. The capacitor C is coupled between the node N1 and the ground terminal GND. The signal conversion circuit SCC is coupled to the nodes N1, N2 and a default voltage VREF respectively. The node N2 is coupled to the sensing voltage VL. The signal conversion circuit SCC converts the sensing voltage VL into a variable reference voltage ACV according to the change of the voltage across the nodes N1 and N2 at both terminals of the resistor R, which is used as the peak voltage of the ramp signal RAMP. When the power converter is in the stable state, the voltage across the resistor R is zero, so the variable reference voltage ACV is the default voltage VREF.

Figure 7:
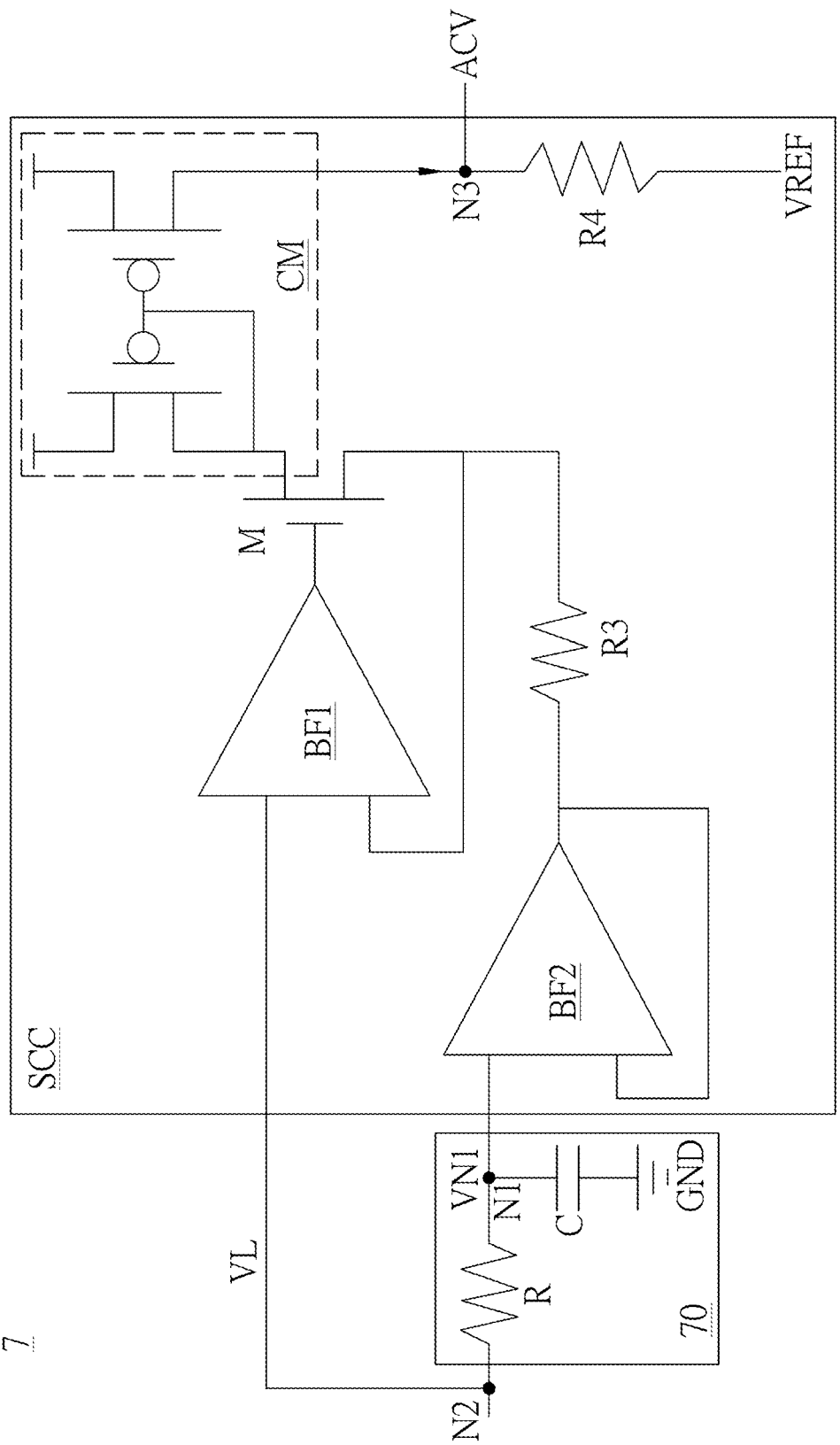
FIG. 7 illustrates an embodiment of the signal conversion circuit in the transient circuit of FIG. 6.

Please refer to FIG. 7. In another embodiment, the transient circuit 7 includes a filter 70 and a signal conversion circuit SCC. The filter 70 includes a resistor R and a capacitor C. The resistor R is located between the nodes N1 and N2. The capacitor C is coupled between the node N1 and the ground terminal GND. The signal conversion circuit SCC includes voltage followers BF1~BF2, resistors R3~R4, a switch M and a current mirror CM. An input terminal of the voltage follower BF1 is coupled to the node N2 and an input terminal of the voltage follower BF2 is coupled to the node N1. The other input terminal and the output terminal of the voltage follower BF2 are both coupled to one terminal of the resistor R3. The other terminal of the resistor R3 is coupled to the other input terminal of the voltage follower BF1 and one terminal of the switch M. The output terminal of the voltage follower BF1 is coupled to the control terminal of the switch M. The other terminal of the switch M is coupled to the input terminal of the current mirror CM. The resistor R4 is coupled between the output terminal of the current mirror CM and the default voltage VREF. The node N3 between the resistor R4 and the current mirror CM outputs the variable reference voltage ACV.

When the power converter is in the stable state, the voltages of the nodes N1 and N2 are equal, so that the voltage across the resistor R, the resistor R3 and the resistor R4 are all zero, and the variable reference voltage ACV outputted by the signal conversion circuit SCC is the default voltage VREF.

When the transient caused by the current sourcing occurs, the sensing current IL is raised, and the sensing voltage VL of the node N2 is also raised accordingly. Since the voltage VN1 of the node N1 needs to charge the capacitor C, its rising speed is slower. The voltage follower BF1 and BF2 will form a voltage difference (VL−VN1) across the resistor R3 and generate a current of (VL−VN1)/R3 on the resistor R3, which is transmitted to the node N3 through the current mirror CM and converted to an adjusted value of the reference voltage ACV through the resistor R4. Moreover, the current generated on the resistor R3 will be decreased as the voltage VN1 is raised, so that the reference voltage ACV will be gradually restored to the default voltage VREF.

Compared to the prior art, the peak voltage of the ramp signal in the control circuit of the power converter of the invention will return to a default voltage after the transient state ends and enters a stable state, so that the ramp signal will not cause the control loop to fail due to current sourcing compression; therefore, it can overcome the shortcoming that the conventional ramp signal is limited by the headroom of the operating voltage (VCC), so as to greatly increase the freedom of circuit design. In addition, the output current feedback control of the control circuit of the power converter of the invention will not fail during the heavy current sourcing period, so it can provide a stable output.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A control circuit of a power converter, coupled to an output circuit, the control circuit comprising:
    a sensing circuit, coupled to the output circuit and configured to provide a current sensing signal;
    a ramp signal generation circuit, comprising a transient circuit and a signal generation circuit, the transient circuit being coupled between the sensing circuit and the signal generation circuit and configured to receive the current sensing signal and generate a variable reference voltage, the signal generation circuit being configured to provide a ramp signal according to the variable reference voltage; and
    a pulse width modulation (PWM) circuit, coupled to the ramp signal generation circuit and the output circuit and configured to provide a PWM signal to the output circuit according to the ramp circuit, wherein when a current sourcing occurs, the current sourcing continues for a first default time, there is a transient state during the current sourcing, and the transient state continues for a second default time less than first default time, the variable reference voltage provided by the transient circuit during the second default time is changed from a default value to an adjusted value, the transient circuit restores the variable reference voltage to the default value after the second default time.

2. The control circuit of claim 1, wherein the variable reference voltage is a peak voltage of the ramp signal.

3. The control circuit of claim 1, wherein the transient circuit comprises:

a filter, coupled to the sensing circuit and configured to receive a reference voltage and the current sensing signal to generate the variable reference voltage.

4. The control circuit of claim 3, wherein the filter comprises a resistor and a capacitor, and the second default time is related to a resistance-capacitance delay generated by the resistor and the capacitor.

5. The control circuit of claim 1, wherein the transient circuit comprises:

a filter comprising a resistor and a capacitor coupled in series between a ground terminal and a sensing voltage, the sensing voltage is related to the current sensing signal; and a signal conversion circuit, coupled to a first node and a second node at both terminals of the resistor respectively and configured to provide the variable reference voltage according to a voltage difference between the first node and the second node.

6. The control circuit of claim 5, wherein the second default time is related to a resistance-capacitance delay generated by the resistance and the capacitor.

* * * * *